United States Patent
Sweet, III et al.

(10) Patent No.: US 11,032,148 B2
(45) Date of Patent: Jun. 8, 2021

(54) MANAGING NETWORK COMMUNICATION OF AN UNMANNED AUTONOMOUS VEHICLE

(71) Applicant: QUALCOMM Incorporated, San Diego, CA (US)

(72) Inventors: Charles Wheeler Sweet, III, San Diego, CA (US); Edward Harrison Teague, San Diego, CA (US); Michael Franco Taveira, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 466 days.

(21) Appl. No.: 15/211,563

(22) Filed: Jul. 15, 2016

(65) Prior Publication Data
US 2017/0295069 A1    Oct. 12, 2017

Related U.S. Application Data

(60) Provisional application No. 62/319,676, filed on Apr. 7, 2016.

(51) Int. Cl.
*G06F 15/16* (2006.01)
*H04L 12/24* (2006.01)
(Continued)

(52) U.S. Cl.
CPC .......... *H04L 41/12* (2013.01); *B64C 39/024* (2013.01); *G07C 5/008* (2013.01);
(Continued)

(58) Field of Classification Search
CPC ... H04L 29/06; H04L 29/08072; H04L 41/12; H04L 67/14; H04L 1/0003; H04L 1/0007; H04L 67/12; B64C 2201/027
(Continued)

(56) References Cited

U.S. PATENT DOCUMENTS 6,584,382 B2 * 6/2003 Karem ................. G05D 1/0038
                                                                  701/3
9,412,278 B1 * 8/2016 Gong ................... G08G 5/0091
(Continued)

FOREIGN PATENT DOCUMENTS

CN       105119650 A    12/2015
WO    2011006434 A1     1/2011
(Continued)

OTHER PUBLICATIONS

Dalmasso I., et al., "WiMAX Networks for Emergency Management Based on UAVs", Satellite Telecommunications (ESTEL), 2012 IEEE First AESS European Conference on, IEEE, Oct. 2, 2012 (Oct. 2, 2012), pp. 1-6, XP032296793, DOI: 10.11 09/ESTEL.2012. 6400206, ISBN: 978-1-4673-4687-0.
(Continued)

*Primary Examiner* — Khanh Q Dinh

(57) ABSTRACT

Embodiments include devices and methods for managing network communication of an unmanned autonomous vehicle (UAV). A processor of the UAV may determine an altitude of the UAV. The processor may optionally also determine a speed or vector of the UAV. Based on the determined altitude and/or speed/vector of the UAV, the processor may adjust the communication parameter of the communication link between the UAV and a communication network. The processor may transmit signals based on the adjusted communication parameter, which may reduce radio frequency interference caused by the transmissions of the UAV with the communication network.

21 Claims, 5 Drawing Sheets

(51) Int. Cl.
*H04B 7/185* (2006.01)
*H04L 1/00* (2006.01)
*B64C 39/02* (2006.01)
*G07C 5/00* (2006.01)
*H04L 29/08* (2006.01)

(52) U.S. Cl.
CPC ....... *H04B 7/18504* (2013.01); *H04L 1/0003* (2013.01); *H04L 1/0007* (2013.01); *H04L 1/0009* (2013.01); *H04L 67/12* (2013.01); *H04L 67/14* (2013.01); *B64C 2201/027* (2013.01); *B64C 2201/042* (2013.01); *B64C 2201/108* (2013.01); *B64C 2201/122* (2013.01); *B64C 2201/145* (2013.01)

(58) Field of Classification Search
USPC .......................... 709/203, 220, 227, 224, 228
See application file for complete search history.

(56) References Cited

U.S. PATENT DOCUMENTS

| | | | | |
|---|---|---|---|---|
| 9,518,821 | B2* | 12/2016 | Malay | G01C 9/005 |
| 9,527,580 | B2* | 12/2016 | Lang | B64C 13/28 |
| 9,527,587 | B2* | 12/2016 | Levien | B64C 39/024 |
| 9,540,102 | B2* | 1/2017 | Levien | B64C 39/024 |
| 9,576,493 | B2* | 2/2017 | Jarrell | G08G 5/0069 |
| 9,691,285 | B2* | 6/2017 | Jarrell | G08G 5/0069 |
| 9,792,613 | B2* | 10/2017 | Gong | G06Q 30/018 |
| 9,805,372 | B2* | 10/2017 | Gong | G08G 5/0034 |
| 9,870,566 | B2* | 1/2018 | Gong | G08G 5/0091 |
| 9,927,809 | B1* | 3/2018 | Tofte | G05D 1/0038 |
| 9,929,914 | B2* | 3/2018 | Luo | B64C 39/024 |
| 2005/0143013 | A1 | 6/2005 | Jha | |
| 2010/0269143 | A1* | 10/2010 | Rabowsky | H04B 7/18591 725/63 |
| 2014/0172194 | A1* | 6/2014 | Levien | B64C 39/024 701/2 |
| 2014/0222248 | A1* | 8/2014 | Levien | B64C 39/024 701/2 |
| 2016/0105233 | A1 | 4/2016 | Jalali | |
| 2016/0196751 | A1* | 7/2016 | Jarrell | G08G 5/0069 340/971 |
| 2016/0196753 | A1* | 7/2016 | Jarrell | G08G 5/0069 701/16 |
| 2016/0288905 | A1* | 10/2016 | Gong | G06F 8/65 |
| 2016/0292403 | A1* | 10/2016 | Gong | G08G 5/0078 |
| 2016/0292696 | A1* | 10/2016 | Gong | G08G 5/0052 |
| 2016/0300495 | A1* | 10/2016 | Kantor | G08G 5/0039 |
| 2016/0306351 | A1 | 10/2016 | Fisher et al. | |
| 2016/0373954 | A1 | 12/2016 | Usui et al. | |
| 2017/0081026 | A1* | 3/2017 | Winn | H04L 67/12 |
| 2017/0295609 | A1* | 10/2017 | Darrow | G05D 1/104 |

FOREIGN PATENT DOCUMENTS

| | | |
|---|---|---|
| WO | 2013113273 A1 | 8/2013 |
| WO | 2014208389 A1 | 12/2014 |
| WO | 2015175054 A2 | 11/2015 |

OTHER PUBLICATIONS

ISO: "Standard Representation of Geographic Point Location by Coordinates", Mar. 20, 2008 (Mar. 20, 2008), XP055455619, 36 Pages, Retrieved from the Internet: URL:https://web.archive.org/web/20111009145601/http://www.xyz.au.com/members/intelligence/pdf_files/ISO_FDIS_6709.pdf [retrieved on Mar. 1, 2018].

Mozaffari M., et al., "Drone Small Cells in the Clouds: Design, Deployment and Performance Analysis", 2015 IEEE Global Communications Conference (GLOBECOM), IEEE, Dec. 6, 2015 (Dec. 6, 2015), pp. 1-6, XP032872775, DOI: 10.1109/GLOCOM.2014.7417609, [retrieved on Feb. 23, 2016].

Van Den Bergh B., et al., "Analysis of Harmful Interference to and from Aerial IEEE 802.11 Systems", Micro Aerial Vehicle Networks, Systems, and Applications for Civilian Use, ACM, 2 Penn Plaza, Suite 701 New York NY 10121-0701 USA, May 18, 2015 (May 18, 2015), pp. 15-19, XP058069741, DOI: 10.1145/2750675.2750685, ISBN: 978-1-4503-3501-0.

Design of Communication Subsystem for Unmanned Aerial Vehicle, May 2015, 53 pages.

Onireti O., et al., "Will 5G See its Blind Side? Evolving 5G for Universal Internet Access," Mar. 31, 2016, 6 pages.

Zhou Y., "Future Communication Model for High-speed Railway Based on Unmanned Aerial Vehicles," 2014, 21 pages.

Lopez-Perez D., et al., "Mobility Management Challenges in 3GPP Heterogeneous Networks", IEEE Communications Magazine, IEEE Service Center, Piscataway, US, vol. 50, No. 12, Dec. 1, 2012 (Dec. 1, 2012 ), pp. 70-78, XP011483265, ISSN: 0163-6804, DOI: 10.1109/MCOM.2012.6384454.

Intel Corporation: "Discussion on Standardization Impacts of UL 256QAM", 3GPP Draft, R1-162372, 3rd Generation Partnership Project (3GPP), Mobile Competence Centre, 658, Route Des Lucioles, F-06921 Sophia-Antipolis Cedex, France, vol. RAN WG1, no. Busan, Korea, Apr. 11, 2016-Apr. 15, 2016, Apr. 2, 2016, XP051080151, Retrieved from the Internet: URL:http://www.3gpp.org/ftp/tsg_ran/WG1_RL1/TSGR1_84b/Docs/.

International Search Report and Written Opinion—PCT/US2017/014891—ISA/EPO—dated Apr. 20, 2017.

Taiwan Search Report—TW106103152—TIPO—dated May 17, 2020. 1page.

* cited by examiner

MANAGING NETWORK COMMUNICATION OF AN UNMANNED AUTONOMOUS VEHICLE

RELATED APPLICATIONS

This application claims the benefit of U.S. Provisional Patent Application 62/319,676 entitled "Altitude Adjusted Rate Plan" filed Apr. 7, 2016, the entire contents of which are hereby incorporated by reference for all purposes.

BACKGROUND

Unmanned autonomous vehicles (UAVs) may be equipped to communicate with cellular communication networks (e.g., 3G, 4G, and/or 5G communication networks). Some UAVs capable of flight may also be referred to as "drones." Such UAVs may include multiple fixed-pitch rotors driven by controllable electric motors, providing take-off, hover, landing, and flight capabilities with a high degree of control and freedom.

Increasingly, UAVs may be equipped to communicate with cellular communication networks (e.g., 3G, 4G, and/or 5G communication networks). As a cellular-capable UAV climbs to higher altitudes, the UAV may receive signals from, and potentially interact with, a greater number of cellular base stations (including other access points), as well as with communications of other communication devices (e.g., mobile phones). When the UAV transmits, the UAV's signals may interfere with signals from these base stations and other communication devices. As the UAV ascends, the UAV's signals may interfere with a greater number of base stations and/or other communication devices. This problem is exacerbated in areas with a greater density of base stations and communication devices, such as urban or suburban environments. While base stations may employ interference cancellation to mitigate interference caused by signals transmitted from UAVs, such interference cancellation systems are not yet widely deployed.

SUMMARY

Various embodiments provide methods implemented by a processor in a UAV for managing network communication of the UAV. Various embodiments may include determining an altitude of the UAV, and adjusting a communication parameter of a communication link between the UAV and a communication network based on the altitude of the UAV. Some embodiments may further include determining a speed of the UAV, and adjusting the communication parameter of the communication link between the UAV and the communication network may be based on the altitude and the speed of the UAV.

In some embodiments, adjusting the communication parameter may include adjusting one or more of a data rate of the communication link, a quality of service of the communication link, a packet size of the communication link, a modulation and coding scheme of the communication link, a handover parameter of the communication link, or a bandwidth used for the communication link. In some embodiments, adjusting the communication parameter of a communication link between the UAV and a communication network based on the altitude of the UAV may include adjusting the communication parameter of the communication link between the UAV and a communication network based on the altitude of the UAV and a data rate versus altitude function provided by the communication network.

Some embodiments may further include determining an interference metric based on the altitude of the UAV, and adjusting the communication parameter of the communication link between the UAV and the communication network may be based on the interference metric. Some embodiments may further include determining a speed of the UAV, and the interference metric may be further based on the speed of the UAV. In some embodiments, the interference metric may be further based on a number of base stations of the communication network detected by the UAV. In some embodiments, the interference metric may be further based on network condition information about the communication network.

In some embodiments, adjusting the communication parameter of the communication link may be performed by a processor of the UAV. In some embodiments, adjusting the communication parameter of the communication link maybe performed by a processor of the UAV in response to an instruction received from the communication network. Some embodiments may further include transmitting signals from the UAV using the adjusted communication parameter.

In some embodiments, the method may be performed by a network element of the communication network. In such embodiments, adjusting a communication parameter of a communication link between the UAV and a communication network based on the altitude of the UAV may include adjusting, based on an instruction from the network element, a communication parameter of a respective communication link between two or more UAVs and the communication network.

Various embodiments further include a UAV having a radio frequency resource and a processor coupled to the radio frequency resource and configured with processor executable instructions to perform operations of the methods summarized above. Various embodiments include a UAV having means for performing functions of the methods summarized above. Various embodiments include a non-transitory processor-readable storage medium having stored thereon processor-executable instructions configured to cause a processor of a UAV to perform operations of the methods summarized above. Various embodiments include a network element of a communication network having a communication interface and a processor coupled to the communication interface and configured with processor-executable instructions to perform operations of the methods summarized above.

BRIEF DESCRIPTION OF THE DRAWINGS

The accompanying drawings, which are incorporated herein and constitute part of this specification, illustrate example embodiments, and together with the general description given above and the detailed description given below, serve to explain the features of various embodiments.

DETAILED DESCRIPTION

Figure 1:
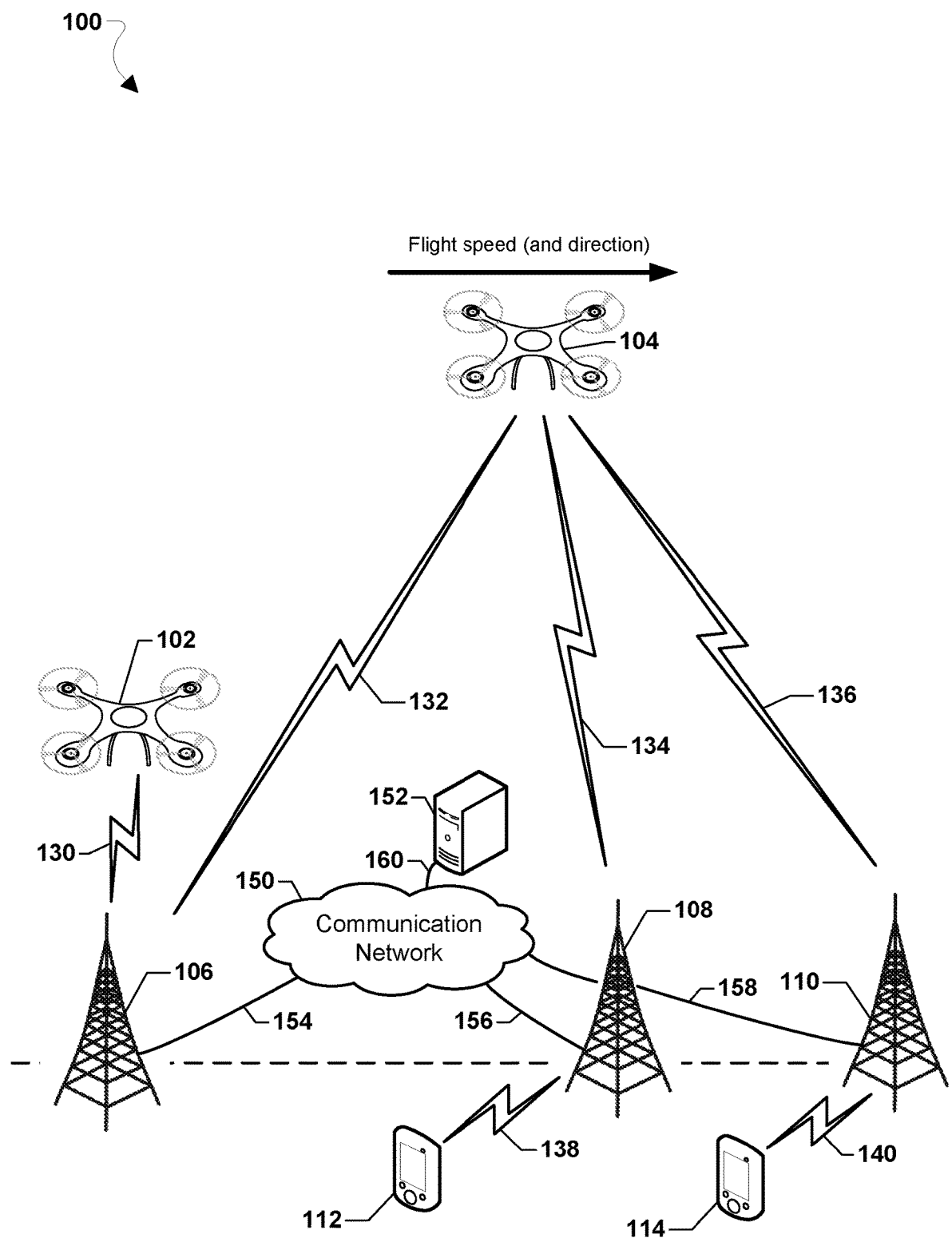
FIG. 1 is a system block diagram of a communication system according to various embodiments.

Various embodiments will be described in detail with reference to the accompanying drawings. Wherever possible, the same reference numbers will be used throughout the drawings to refer to the same or like parts. References made to particular examples and embodiments are for illustrative purposes, and are not intended to limit the scope of the claims.

Various embodiments provide methods implemented by a processor in a UAV for managing network communication of the UAV based on flight parameters (e.g., altitude, speed, and/or flight path). In various embodiments, the processor of the UAV may adjust a communication parameter of a communication link between the UAV and the communication network based on the determined altitude of the UAV. Such adjustments in the communication parameter may be determined further based on a data rate-per-altitude/data rate versus altitude function provided by the network. Some embodiments may include adjusting the communication parameter further based on a speed of the UAV or a speed and direction of the UAV.

As used herein, the term "UAV" refers to one of various types of unmanned aerial vehicles. A UAV may include an onboard computing device configured to fly and/or operate the UAV without remote operating instructions (i.e., autonomously), such as from a human operator or remote computing device. Alternatively, the onboard computing device may be configured to fly and/or operate the UAV with some remote operating instruction or updates to instructions stored in a memory of the onboard computing device. A UAV may be propelled for flight using a plurality of propulsion units, each including one or more rotors, that provide propulsion and/or lifting forces for the UAV. In addition, a UAV may include wheels, tank-tread, or other non-aerial movement mechanisms to enable movement on the ground or through water. UAV propulsion units may be powered by one or more types of electric power sources, such as batteries, fuel cells, motor-generators, solar cells, or other sources of electric power, which may also power the onboard computing device, navigation components, and/or other onboard components.

UAVs are commonly used in a variety of applications, including surveying, photography, power or communications repeater functions, and delivery, among other things.

Various embodiments provide methods implemented by a processor in a UAV for managing network communication of the UAV. The UAV may include a flight controller that may communicate securely with a modem that is configured for wireless communication with a communication network. In some embodiments, the processor configured for managing network communication of the UAV may be combined with the modem. In some embodiments, the processor may also be configured with processor-executable instructions to function as the flight controller. In some embodiments, the processor may be configured to exchange data with the flight controller, which may be implemented in hardware, in software executing in a separate processor, or in a combination of hardware and software. In various embodiments, the processor of the UAV may determine an altitude of the UAV, such as (but not limited to) by sampling data from a barometric sensor, obtaining altitude coordinates from a GPS receiver, or receiving the altitude data from the flight controller. In some embodiments, the processor may further determine a flight speed of the UAV, such as by obtaining the flight speed from the flight controller or processing coordinate information over time from a GPS receiver. In some embodiments, the processor may further determine a flight vector (i.e., a direction of flight and a flight speed of the UAV) such as by obtaining the flight speed from the flight controller or processing coordinate information over time from a GPS receiver. In some embodiments, such UAVs may operate below 5000 ft. In some embodiments, the UAVs may operate below 500 ft.

In various embodiments, the processor of the UAV may adjust a communication parameter of a communication link between the UAV and the communication network based on the altitude of the UAV. In some embodiments, the processor of the UAV may adjust a communication parameter of a communication link between the UAV and the communication network based on the altitude of the UAV and a data rate versus altitude function, which may be provided by the communication network. In some embodiments, the processor may adjust the communication parameter of the communication link based on the determined altitude and the flight speed (or vector) of the UAV. In some embodiments, the processor may adjust the communication parameter to reduce radio frequency interference caused by the UAV with the communication network.

In some embodiments, the processor of the UAV may adjust a data rate of the communication link. In some embodiments, the processor of the UAV may adjust a quality of service (QoS) of the communication link. In some embodiments, the processor of the UAV may adjust a packet size of data sent from or to the UAV over the communication link. In some embodiments, the processor of the UAV may adjust a modulation and coding scheme (MCS) used over the communication link. In some embodiments, the processor of the UAV may adjust a handover parameter, such as a handover threshold, to adjust a likelihood of the performance of a handover of the communication link to another base station or other access point.

In some embodiments, the processor may determine an interference metric based on the determined altitude of the UAV. In some embodiments, the processor may determine the interference metric based on the determined altitude and the flight speed (or vector) of the UAV. In some embodiments, the interference metric may represent an actual level of interference caused by RF transmissions of the UAV. For example, the UAV may receive from the communication network a message including an indication of a level of interference caused by the UAV with the communication network, and the UAV may determine the interference metric based on the indication of the level of interference from the communication network.

In some embodiments, the interference metric may represent a potential level of interference that may be caused with the communication network by RF transmissions of the UAV. For example, the processor may determine the interference metric based on the altitude (and potentially also the speed/vector) of the UAV. The processor may also determine the interference metric based on a number of base stations (or other access points), and/or a number of other devices (such as other UAVs, or other communication devices) detected by the UAV (e.g., the UAV may detect a pilot signal, or a bearer signal, of a base station, access point, or another device that communicates with the communication network).

The processor may also determine the interference metric based on a classification of the environment of the UAV. For example, the processor may receive information from one or more sensors of the UAV, and may classify the environment of the UAV based on the received sensor information. For example, the processor may receive pictures of the local area from a camera of the UAV, and the processor may classify the environment of the UAV based on the received camera information.

The processor may also determine the interference metric based on information received by the UAV from the communication network. For example, the UAV may receive a message from the communication network including an indication of one or more of network congestion (RF communication link congestion and/or backhaul congestion), frequency utilization, communication link utilization, and a density of other wireless communication devices. The processor may determine the interference metric based on the information received by the UAV from the communication network.

In some embodiments, the processor of the UAV may determine the interference metric in addition to the altitude of the UAV (and possibly the flight speed/vector of the UAV). In some embodiments, the determined interference metric may be based in part on the determined altitude of the UAV (as well as potentially the flight speed/vector of the UAV).

In various embodiments, the processor of the UAV may adjust the communication parameter of a communication link between the UAV and the communication network based on the determined altitude of the UAV (as well as the UAV flight speed or vector). In some embodiments, the processor may adjust the communication parameter of the communication link based on the determined interference metric and the determined UAV altitude (as well as the UAV flight speed or vector). In some embodiments, the processor of the UAV may report one or more of the UAV's altitude, speed/vector, and determined interference metric to the communication network, and the processor of the UAV may adjust the communication parameter in response to an instruction received by the UAV from the communication network.

Various embodiments may be implemented within a variety of communication systems 100, an example of which is illustrated in FIG. 1. With reference to FIG. 1, the communication system 100 may include UAVs 102 and 104, base stations 106, 108, and 110, wireless communication devices 112 and 114, a communication network 150, and a network element 152.

The base stations 106, 108, and 110 may include a base station or other access point, which may provide wireless communications to access the communication network 150 over a wired and/or wireless communications backhaul, such as communication links 154, 156, and 158. The base stations 106, 108, 110, may include base stations configured to provide wireless communications over a wide area (e.g., macro cells), as well as small cells or a wireless access points, which may include a micro cell, a femto cell, a pico cell, a Wi-Fi access point, and other similar network access points. The wireless communication devices 112 and 114 may communicate with the base station 108 over communication link 138, and with the base station 110 over communication link 140, respectively. The UAV 102 may communicate with base station 106, and the UAV 104 may communicate with one or more of the base stations 106, 108, and 110 over communication links 132, 134, and 136, respectively.

Each of the wireless communication links 130, 132, 134, 136, 138, and 140 may include a plurality of carrier signals, frequencies, or frequency bands, each of which may include a plurality of logical channels. Each of the wireless communication links 130, 132, 134, 136, 138, and 140 may utilize one or more radio access technologies (RATs). Examples of RATs that may be used in one or more of the various wireless communication 130, 132, 134, 136, 138, and 140 include 3GPP Long Term Evolution (LTE), 3G, 4G, 5G, Global System for Mobility (GSM), Code Division Multiple Access (CDMA), Wideband Code Division Multiple Access (WCDMA), Worldwide Interoperability for Microwave Access (WiMAX), Time Division Multiple Access (TDMA), and other mobile telephony communication technologies cellular RATs. Further examples of RATs that may be used in one or more of the various wireless communication links within the communication environment 100 include medium range protocols such as Wi-Fi, LTE-U, LTE-Direct, LAA, MuLTEfire, and relatively short range RATs such as ZigBee, Bluetooth, and Bluetooth Low Energy (LE).

The network element 152 may communicate with the communication network 150 over a communication link 160. The network element 152 may include a server or another similar network element of the communication network 150. In some embodiments, the network element 152 may be configured to receive (e.g., via telemetry) flight information from the UAV 102, 104, such altitude information, speed and/or vector information, and sensor information, and other similar information. In some embodiments, the network element 152 may be configured to determine the UAV's altitude and/or speed from the received flight information, and adjust a communication parameter of the communication link between the UAV 102, 104 and the communication network 150 based on the UAV's altitude and/or speed.

As a UAV climbs to higher altitudes, the UAV may receive signals from, and potentially interact with, a greater number of base stations as well as with communications of other communication devices (e.g., mobile phones). For example, the UAV 102, located at a relatively low altitude, may communicate with, and may potentially interfere with communications of, the base station 106. In contrast, the UAV 104, located at a relatively higher altitude, may communicate with, and may potentially interfere with communications of, the base stations 106, 108, and 110, as well as potentially the wireless communication devices 112 and 114. Thus, a UAV at a higher altitude (e.g., the UAV 104) has a greater potential to cause RF interference with the communication system 100 than a UAV at a lower altitude (e.g., the UAV 102). The interference caused by the signal transmissions from the UAV may reduce overall communication network capability and efficiency.

The amount and nature of interference caused by a UAV's signal transmissions may change as the UAV moves through the environment, e.g., at a flight speed (and in a direction) of the UAV 104. For example, the UAV 104 may at a first time transmit signals that cause interference with the base station 106. As the UAV 104 moves through the environment, the UAV 104 may move away from the base station 106 and approach the base station 108. Signal transmissions from the UAV 104 may thus interfere with the base stations 106 and 108.

Figure 2:
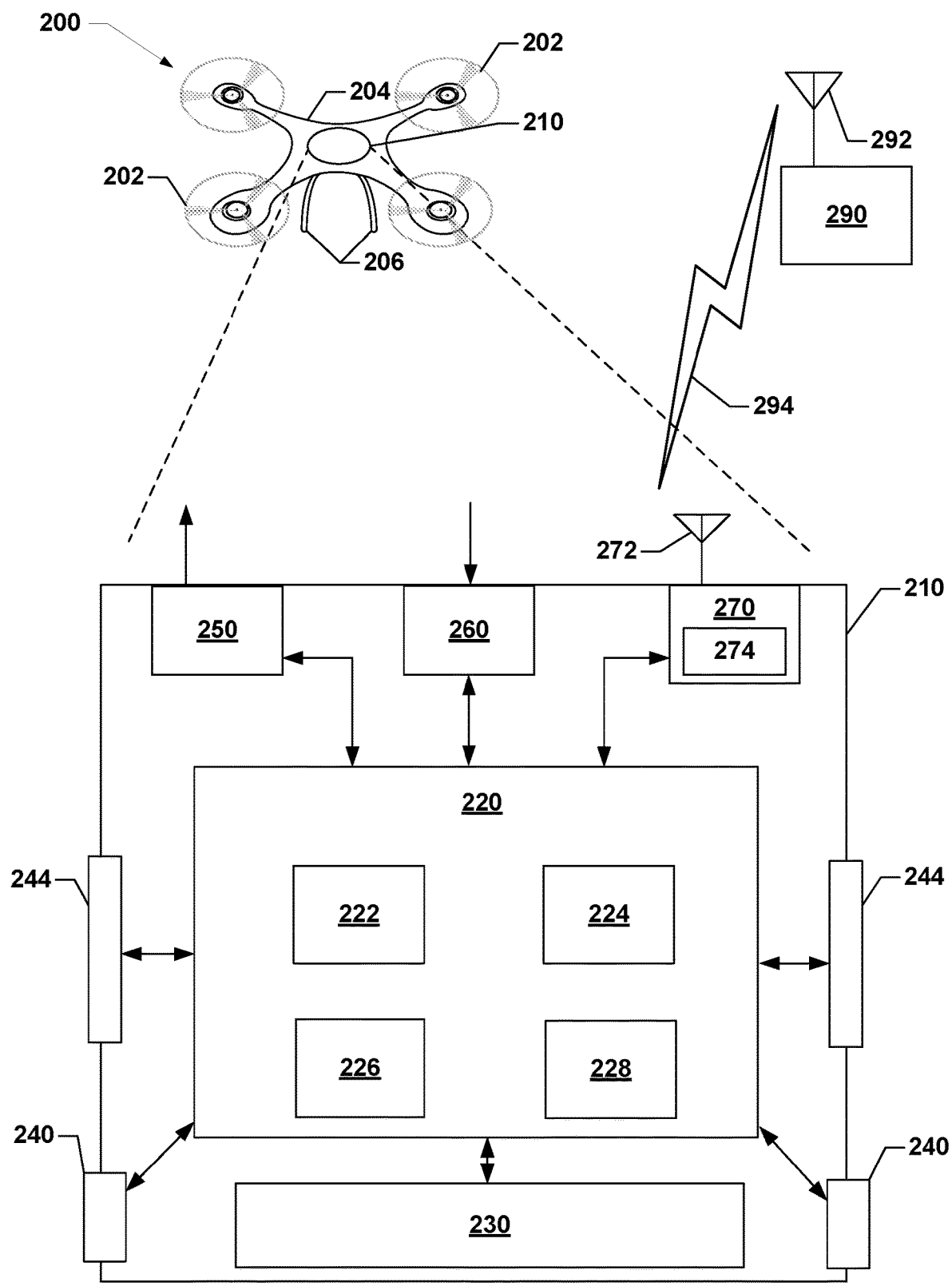
FIG. 2 is a component block diagram illustrating components of a UAV according to various embodiments.

UAVs may be winged or rotorcraft varieties. FIG. 2 illustrates an example UAV 200 of a rotary propulsion design that utilizes one or more rotors 202 driven by corresponding motors to provide lift-off (or take-off) as well as other aerial movements (e.g., forward progression, ascension, descending, lateral movements, tilting, rotating, etc.). The UAV 200 is illustrated as an example of a UAV that may utilize various embodiments, but is not intended to imply or require that various embodiments are limited to rotorcraft UAVs. Instead, various embodiments may be use with winged UAVs as well. Further, various embodiments may equally be used with land-based autonomous vehicles, water-borne autonomous vehicles, and space-based autonomous vehicles.

With reference to FIGS. 1 and 2, the UAV 200 may be similar to the UAVs 102 and 104. The UAV 200 may include a number of rotors 202, a frame 204, and landing columns 206 or skids. The frame 204 may provide structural support for the motors associated with the rotors 202. The landing columns 206 may support the maximum load weight for the combination of the components of the UAV 200 and, in some cases, a payload. For ease of description and illustration, some detailed aspects of the UAV 200 are omitted such as wiring, frame structure interconnects, or other features that would be known to one of skill in the art. For example, while the UAV 200 is shown and described as having a frame 204 having a number of support members or frame structures, the UAV 200 may be constructed using a molded frame in which support is obtained through the molded structure. While the illustrated UAV 200 has four rotors 202, this is merely exemplary and various embodiments may include more or fewer than four rotors 202.

The UAV 200 may further include a control unit 210 that may house various circuits and devices used to power and control the operation of the UAV 200. The control unit 210 may include a processor 220, a power module 230, sensors 240, payload-securing units 244, an output module 250, an input module 260, and a radio module 270.

The processor 220 may be configured with processor-executable instructions to control travel and other operations of the UAV 200, including operations of the various embodiments. The processor 220 may include or be coupled to a navigation unit 222, a memory 224, a gyro/accelerometer unit 226, and an avionics module 228. The processor 220 and/or the navigation unit 222 may be configured to communicate with a server through a wireless connection (e.g., a cellular data network) to receive data useful in navigation, provide real-time position reports, and assess data.

The avionics module 228 may be coupled to the processor 220 and/or the navigation unit 222, and may be configured to provide travel control-related information such as altitude, attitude, airspeed, heading and similar information that the navigation unit 222 may use for navigation purposes, such as dead reckoning between Global Navigation Satellite System (GNSS) position updates. The gyro/accelerometer unit 226 may include an accelerometer, a gyroscope, an inertial sensor, or other similar sensors. The avionics module 228 may include or receive data from the gyro/accelerometer unit 226 that provides data regarding the orientation and accelerations of the UAV 200 that may be used in navigation and positioning calculations.

The processor 220 may further receive additional information from the sensors 240 that may be used in navigation and positioning calculations. For example, the sensors 240 may include an optical sensor (e.g., capable of sensing visible light, infrared, ultraviolet, and/or other wavelengths of light), and RF sensor, a camera, a barometer, a sonar emitter/detector, a radar emitter/detector, a microphone or another acoustic sensor, or another sensor that may provide information usable by the processor 220 for navigation and positioning calculations.

Additionally, the sensors 240 may include contact or pressure sensors that may provide a signal that indicates when the UAV 200 has made contact with a surface. The payload-securing units 244 may include an actuator motor that drives a gripping and release mechanism and related controls that are responsive to the control unit 210 to grip and release a payload in response to commands from the control unit 210.

The power module 230 may include one or more batteries that may provide power to various components, including the processor 220, the sensors 240, the payload-securing units 244, the output module 250, the input module 260, and the radio module 270. In addition, the power module 230 may include energy storage components, such as rechargeable batteries. The processor 220 may be configured with processor-executable instructions to control the charging of the power module 230 (i.e., the storage of harvested energy), such as by executing a charging control algorithm using a charge control circuit. Alternatively or additionally, the power module 230 may be configured to manage its own charging. The processor 220 may be coupled to the output module 250, which may output control signals for managing the motors that drive the rotors 202 and other components.

The UAV 200 may be controlled through control of the individual motors of the rotors 202 as the UAV 200 progresses toward a destination. The processor 220 may receive data from the navigation unit 222 and use such data in order to determine the present position and orientation of the UAV 200, as well as the appropriate course towards the destination or intermediate sites. In various embodiments, the navigation unit 222 may include a GNSS receiver system (e.g., one or more global positioning system (GPS) receivers) enabling the UAV 200 to navigate using GNSS signals. Alternatively or in addition, the navigation unit 222 may be equipped with radio navigation receivers for receiving navigation beacons or other signals from radio nodes, such as navigation beacons (e.g., very high frequency (VHF) omnidirectional range (VOR) beacons), Wi-Fi access points, cellular network sites, radio station, remote computing devices, other UAVs, etc.

The radio module 270 may be configured to receive navigation signals, such as signals from aviation navigation facilities, etc., and provide such signals to the processor 220 and/or the navigation unit 222 to assist in UAV navigation. In various embodiments, the navigation unit 222 may use signals received from recognizable radio frequency (RF) emitters (e.g., AM/FM radio stations, Wi-Fi access points, and cellular network base stations) on the ground. The locations, unique identifiers, signal strengths, frequencies, and other characteristic information of such RF emitters may be stored in a memory and used to determine position (e.g., via triangulation and/or trilateration) when RF signals are received by the radio module 270. For example, the information of the RF emitters may be stored in the memory 224 of the UAV 200, in a ground-based server in communication with the processor 220 via a wireless communication link, or in a combination of the memory 224 and a ground-based server.

The radio module 270 may include a modem 274 and a transmit/receive antenna 272. The radio module 270 may be configured to conduct wireless communications with a variety of wireless communication devices (e.g., wireless communication device 290), examples of which include a base station or cell tower (e.g., the base stations 106, 108, and 110), a beacon, server, a smartphone, a tablet, or another computing device with which the UAV 200 may communicate. The processor 220 may establish a bi-directional wireless communication link 294 via the modem 274 and the antenna 272 of the radio module 270 and the wireless communication device 290 via a transmit/receive antenna 292. In some embodiments, the radio module 270 may be configured to support multiple connections with different wireless communication devices using different radio access technologies. In some embodiments, the radio module 270 and the processor 220 may communicate over a secured communication link. The security communication links may use encryption or another secure means of communication in order to secure the communication between the radio module 270 and the processor 220. In some embodiments, the processor 220 and the modem 274 may communicate over the secured communication link.

In various embodiments, the wireless communication device 290 may be connected to a server through intermediate access points. In an example, the wireless communication device 290 may be a server of a UAV operator, a third party service (e.g., package delivery, billing, etc.), or a site communication access point. The UAV 200 may communicate with a server through one or more intermediate communication links, such as one or more network nodes or other communication devices. In some embodiments, the UAV 200 may include and employ other forms of radio communication, such as mesh connections with other UAVs or connections to other information sources (e.g., balloons or other stations for collecting and/or distributing weather or other data harvesting information).

In various embodiments, the control unit 210 may be equipped with the input module 260, which may be used for a variety of applications. For example, the input module 260 may receive images or data from an onboard camera or sensor, or may receive electronic signals from other components (e.g., a payload).

While the various components of the control unit 210 are illustrated as separate components, some or all of the components (e.g., the processor 220, the output module 250, the radio module 270, and other units) may be integrated together in a single device or module, such as a system-on-chip module.

Figure 3:
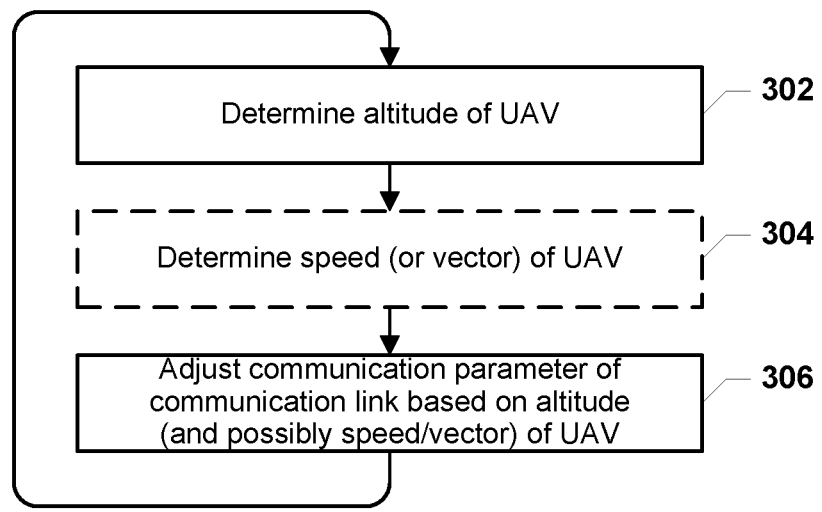
FIG. 3 is a process flow diagram illustrating a method of managing network communication of a UAV according to various embodiments.

FIG. 3 illustrates a method 300 of managing network communication of a UAV (e.g., 102, 104, and 200 in FIGS. 1 and 2) according to various embodiments. With reference to FIGS. 1-3, the method 300 may be implemented by a processor (e.g., the processor 220 and/or the like) of the UAV. In some embodiments, the method 300 may also be implemented by (in addition to or as an alternative of) a processor of a network element (e.g., the network element 152).

In block 302, the processor may determine an altitude of the UAV. For example, the processor may receive information from one or more sensors or other data inputs (e.g., barometer, a GPS system, sonar, and the like) and based on the received information the processor may determine the altitude of the UAV. In embodiments in which the method 300 is implemented (at least partially) by the network element, the network element may determine the UAV's altitude by receiving altitude information from the UAV (e.g., in response to a request, on a periodic basis, etc.) or obtaining the UAV's altitude from flight information transmitted by the UAV.

In optional block 304, the processor may determine a speed (or a vector) of the UAV. For example, using information from the one or more sensors or other data inputs the processor may determine the speed (or vector) of the UAV. In embodiments in which the method 300 is implemented (at least partially) by the network element, the network element may determine the speed (or vector) of the UAV by receiving the speed information from the UAV (e.g., in response to a request, on a periodic basis, etc.) or obtaining the UAV's speed from flight information transmitted by the UAV.

In block 306, the processor may adjust a communication parameter based at least in part on the determined altitude of the UAV. In some embodiments, the processor of the UAV may adjust a communication parameter of a communication link between the UAV and the communication network based on the determined altitude of the UAV. In some embodiments, the processor of the UAV may adjust the communication parameter of the communication link between the UAV and a communication network based on the altitude of the UAV and a data rate versus altitude function provided by the communication network. In some embodiments, such a data rate versus altitude function may be provided in the form of a data table suitable for use in a look-up process using altitude as a look up parameter. In embodiments in which the method 300 is implemented (at least partially) by the network element, the network element may adjust the communication parameter based at least in part on the determined altitude of the UAV in block 306 by sending a message or a command to the UAV. The network element may also make similar adjustments in communication parameter in transmissions sent to the UAV.

In some embodiments, the processor may adjust the communication parameter of the communication link in block 306 based on the determined altitude and the flight speed (or vector) of the UAV. In some embodiments, the processor may adjust the communication parameter based on a network topology, such as a number and/or density of base stations and/or other communication devices, that are present along the direction of motion of the UAV (e.g., ahead of the UAV, below a projected or anticipated flight path of the UAV, etc.). In some embodiments, the processor may adjust the communication parameter to reduce radio frequency interference caused by the UAV with the communication network.

In some embodiments, the processor of the UAV may adjust a data rate of the communication link in block 306. In some embodiments, the processor of the UAV may adjust a quality of service (QoS) of the communication link in block 306. In some embodiments, the processor of the UAV may adjust a packet size of data sent from or to the UAV over the communication link in block 306. In some embodiments, the processor of the UAV may adjust a modulation and coding scheme (MCS) used over the communication link in block 306. In some embodiments, the processor of the UAV may adjust a handover parameter in block 306, such as a handover threshold, to adjust a likelihood of the performance of a handover of the communication link to another base station or other access point.

The processor may continue to monitor the altitude of the UAV in block 302 and repeat the operations of blocks 304 and 306, for example, in response to a change in altitude. Thus, the processor may iteratively monitor the altitude of the UAV (as well as optionally the speed (or vector) of the UAV) and may adjust a communication parameter of the communication link between the UAV and the communication network.

Figure 4:
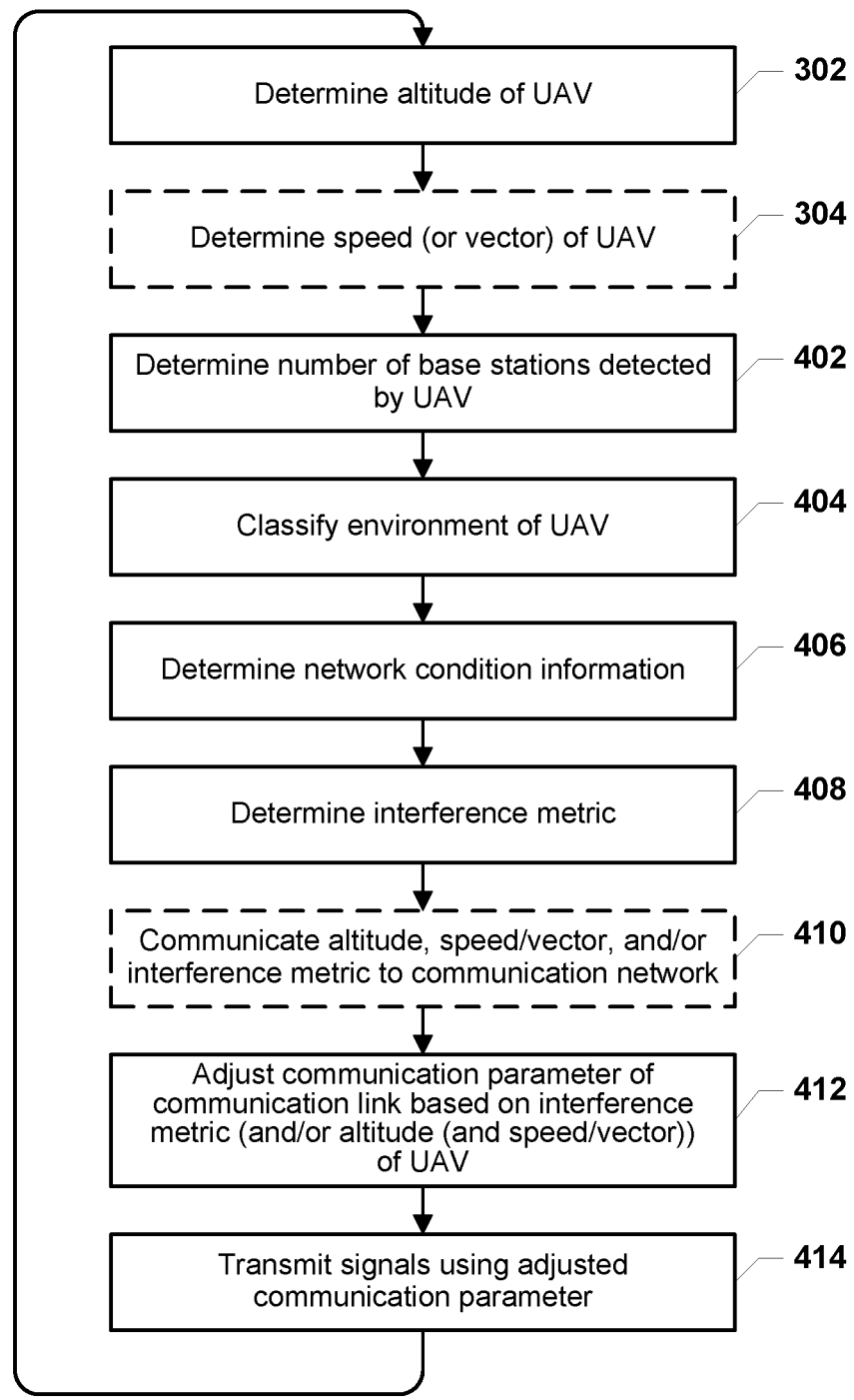
FIG. 4 is a process flow diagram illustrating a method of managing network communication of a UAV according to various embodiments.
Figure 5:
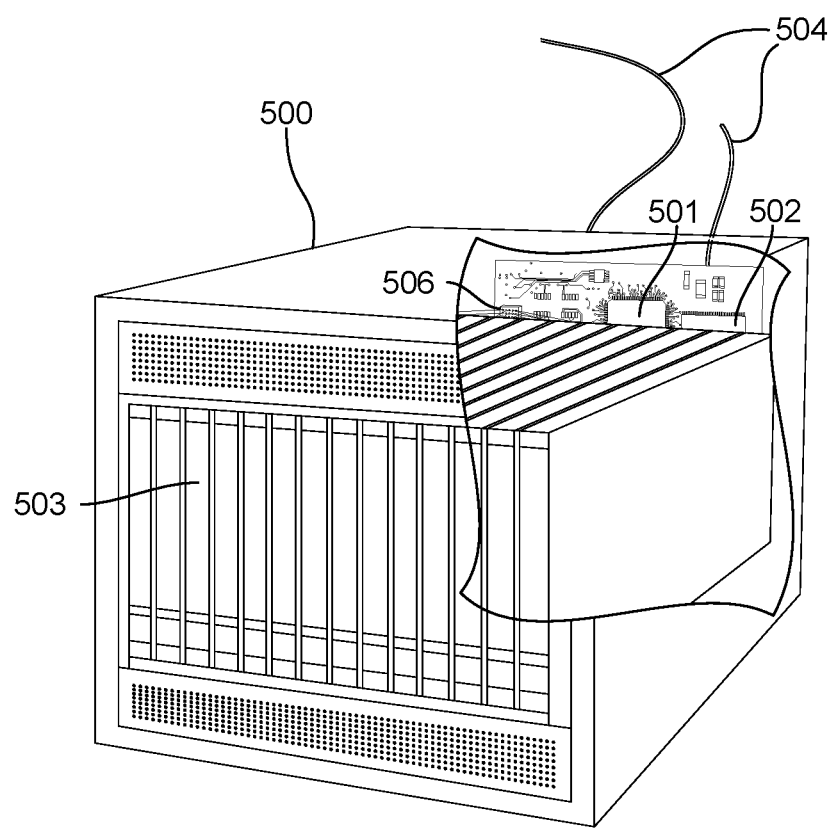
FIG. 5 is a component block diagram illustrating a network element according to various embodiments.

FIG. 4 illustrates a method 400 of managing network communication of a UAV (e.g., 102, 104, and 200 in FIGS. 1 and 2) according to various embodiments. With reference to FIGS. 1-4, the method 400 may be implemented by a processor (e.g., the processor 220 and/or the like) of the UAV. In blocks 302 and 304, the processor may perform operations of like-numbered blocks of the method 300 as described. In some embodiments, the method 300 may also be implemented by (in addition to or as an alternative of) a processor of a network element (e.g., the network element 152).

In block 402, the processor may determine a number of base stations detected by the UAV. For example, the processor of the UAV may detect a signal from one or more base stations (e.g., the base stations 106, 108, and 110). The signal may include a pilot signal, a bearer signal, or some other signal transmitted by the one or more base stations. In some embodiments, the UAV may also detect a signal from one or more other devices, such as, for example, another UAV, or a wireless communication device). Based on any detected signals, the processor may determine a number of base stations (as well as other devices) that are detected by the UAV. In general, the more base stations and other devices that are detected by the UAV, the greater the potential for signals transmitted from the UAV to cause interference with other communications in the communication system. In embodiments in which the method 400 is implemented (at least partially) by the network element, the network element may determine the number of base stations detected by the UAV by receiving information from the UAV (e.g., in response to a request, on a periodic basis, etc.).

In block 404, the processor may classify the environment of the UAV. For example, the processor may classify the environment generally surrounding or generally in proximity to the UAV. In some embodiments, the processor may classify the environment based on information from one or more sensors of the UAV. For example, the processor may analyze images from a camera to determine the presence of buildings and other structures, roads, infrastructure, and other human artifacts, as well as the presence of trees, fields, and other elements of a natural landscape. In some embodiments, based on the analyze images, the processor may classify the environment as, for example, urban, or suburban, or rural. In some embodiments, the processor may also use information such as the number of base stations and/or other devices detected by the UAV to classify the environment. In general, the UAV has a greater potential to cause interference when transmitting signals in an urban or suburban environment (i.e., an area in which base stations and other devices are more densely located) than in a rural environment. In embodiments in which the method 400 is implemented (at least partially) by the network element, the network element may classify the environment of the UAV based on information received from the UAV (e.g., in response to a request, on a periodic basis, etc.).

In block 406, the processor may determine network condition information. For example, the processor may receive a message from the communication network (e.g., from a base station) indicating network condition information of the communication network. In some embodiments, the message may include an indication of one or more of network congestion (including RF communication link congestion and/or backhaul congestion), frequency utilization of one or more frequencies or frequency bands used in the communication network, communication link utilization (e.g., an indication of bandwidth utilization or another metric of wireless communication resource utilization, a number of communication devices using wireless communication resources, and number of concurrent communication sessions managed by base station, or another metric communication link utilization), and a density of other wireless communication devices (e.g., a number of communication devices in communication with a base station, a number of communication devices in proximity to the base station whether in an idle state or in an active state, and the like). In embodiments in which the method 400 is implemented (at least partially) by the network element, the network element may determine network condition information based on information received from the UAV (e.g., in response to a request, on a periodic basis, etc.).

In block 408, the processor may determine an interference metric. In some embodiments, the interference metric may represent an actual level of interference caused by RF transmissions of the UAV. In some embodiments, the interference metric may represent a potential level of interference that may be caused with the communication network by RF transmissions of the UAV. For example, the UAV may receive from the communication network a message including an indication of a level of interference caused by the UAV with the communication network, and the UAV may determine the interference metric based on the indication of the level of interference from the communication network. As another example, the processor may determine the interference metric based on the altitude (and potentially also the speed/vector) of the UAV. As another example, the processor may determine the interference metric based on the number of base stations and/or other communication devices detected by the UAV. As another example, the processor may determine the interference metric based on the classification of the environment. As another example, the processor may determine interference metric based on the network condition information. As a further example, the processor may determine interference metric based on any one or more of the foregoing criteria. In some embodiments, the processor of the UAV may determine the interference metric in addition to the altitude of the UAV (and possibly the flight speed/vector of the UAV). In some embodiments, the determined interference metric may be based in part on the determined altitude of the UAV (as well as potentially the flight speed/vector of the UAV). In embodiments in which the method 400 is implemented (at least partially) by the network element, the network element may determine the interference metric based on information received from the UAV (e.g., in response to a request, on a periodic basis, etc.).

In optional block 410, the processor of the UAV may communicate the altitude of the UAV, the speed/vector of the UAV, and/or the interference metric to the communication network. In some embodiments, the processor of the UAV may communicate this information to a network element of the communication network (e.g., the network element 152) that is configured to receive and/or process the altitude, speed/vector, and/or interference metric received from the UAV. In some embodiments, the network element 152 may perform one or more aspects of the method 400. In some embodiments, the processor may periodically send flight information, including the altitude of the UAV, the speed/vector of the UAV, and/or the interference metric, to the communication network. In some embodiments, the network element may request the altitude of the UAV, the speed/vector of the UAV, and/or the interference metric from the UAV.

In block 412, the processor of the UAV may adjust a communication parameter of a communication link between the UAV and the communication network based on the determined altitude of the UAV. In some embodiments, the processor may adjust the communication parameter of the communication link in block 412 based on the determined altitude and the flight speed (or vector) of the UAV. In some embodiments, the processor may adjust the communication parameter to reduce radio frequency interference caused by the UAV with the communication network. In some embodiments in which the method 400 is implemented (at least partially) by the network element, the network element may send a message or a command to the UAV to instruct the UAV to adjust the communication parameter. The processor of the UAV may then adjust the communication parameter in response to a message or a command from the network element. In some embodiments in which the method 400 is implemented (at least partially) by the network element, the network element may adjust the communication parameter of the communication link (e.g., uplink transmissions), including any or all of the adjustments described below.

In some embodiments, the processor may adjust a data rate of the communication link based on the determined altitude, speed/vector, and/or interference metric in block 412. For example, the processor may reduce a rate at which the UAV transmits data to communication network. In some embodiments, the processor of the UAV may adjust a QoS of the communication link based on the determined altitude, speed/vector, and/or interference metric in block 412. For example, the processor may reduce a communication link requirement such as, for example, a minimum throughput, a minimum data rate, a maximum error rate, a number of retransmission requests, or another communication link requirement.

In some embodiments, the processor of the UAV may adjust a packet size of data sent from or to the UAV over the communication link based on the determined altitude, speed/vector, and/or interference metric in block 412. In some embodiments, the processor of the UAV may reduce a packet size (or another amount of data sent over time, or an amount of data sent per transmission opportunity) in block 412. In some embodiments, the processor of the UAV may adjust an MCS used over the communication link based on the determined altitude, speed/vector, and/or interference metric in block 412. For example, the processor may reduce a currently-used MCS to a lower MCS.

In some embodiments, the processor of the UAV may adjust a handover parameter in block 412, such as a handover threshold, based on the determined altitude, speed/vector, and/or interference metric, to adjust a likelihood of the performance of a handover of the communication link to another base station or other access point. For example, as a UAV moves away from a base station with which it is in communication, the processor may increase the transmit power level of signals from the UAV. Signals transmitted at an increased power level may have a greater potential of causing interference with base stations and/or other communication devices of the communication network. The processor of the UAV may, for example, adjust a handover parameter in block 412 to increase the likelihood that a communication link between the UAV and the communication network will be handed over to a base station that is closer to the UAV. In some embodiments, the processor may adjust the handover parameter based on the altitude of the UAV, as well as possibly the speed (or vector) of the UAV. In some embodiments, the processor may also adjust the handover parameter in block 412 based on the determined number of base stations detected by the UAV, the classification of the environment, and/or the determined network condition information.

In some embodiments, the processor of the UAV may adjust a bandwidth used for the communication link between the UAV and the communication network based on the determined altitude, speed/vector, and/or interference metric in block 412. For example, in some modulation schemes used in some radio access technologies (e.g., Orthogonal Frequency-Division Multiplexing (OFDM)), adjusting the bandwidth used in the modulation scheme may affect range performance of the communication link between the UAV and the communication network.

In some embodiments, the processor of the UAV may adjust a frequency or frequency band used over the communication link between the UAV and the communication network based on the determined altitude, speed/vector, and/or interference metric in block 412. For example, the network operator may allocate a range of frequency bands or frequency spectrum for use by the UAVs at one or more altitudes. In some embodiments, the processor of the UAV may select the frequency or frequency band from among a range of frequencies or frequency bands allocated by the network operator for use at an altitude of the UAV. In some embodiments, the processor of the UAV may select the frequency or frequency band to reduce potential interference with other communications of the communication network.

In some embodiments, the processor of the UAV may adjust the communication parameter in block 412 in response to an instruction received by the UAV from the communication network (e.g., from the network element 152). For example, in response to the UAV communicating one or more of the UAV's altitude, speed/vector, and determined interference metric to the communication network, the UAV may receive an instruction from the communication network to adjust a communication parameter of the communication link.

In some embodiments, the communication network (e.g., the network element 152) may instruct a change in a communication parameter for two or more UAVs operating within the communication system 100. In some embodiments, the communication network may perform one or more of the operations of the method 400 using telemetry from two or more UAVs (including, for example, altitude information, speed information, vector information, a number of base stations detected by each UAV, etc.). In such embodiments, the communication network may instruct a change in a communication parameter of a communication link between the communication network and two or more UAVs.

In block 414, the UAV may transmit signals using the adjusted communication parameter. In various embodiments, transmitting signals using the adjusted communication parameter may reduce radio frequency interference caused by the signals transmitted by the UAV to the communication network.

The processor may continue to monitor the altitude of the UAV in block 302 and repeat the operations of the method 400 in response to changes in altitude. Thus, the processor may iteratively monitor the altitude of the UAV and/or various other information and may adjust the communication parameter of the communication link between the UAV and the communication network.

In various embodiments, the processor of the UAV may communicate with a network element of a communication network. Such network elements may typically include, at least, the components illustrated in FIG. 5, which illustrates an example network element, server 500. With reference to FIGS. 1-5, the server 500 may typically include a processor 501 coupled to volatile memory 502 and a large capacity nonvolatile memory, such as a disk drive 503. The server 500 may also include a floppy disc drive, compact disc (CD) or digital video disc (DVD) drive 506 coupled to the processor 501. The server 500 may also include network access ports 504 (or interfaces) coupled to the processor 501 for establishing data connections with a network, such as the Internet and/or a local area network coupled to other system computers and servers. Similarly, the server 500 may include additional access ports, such as USB, Firewire, Thunderbolt, and the like for coupling to peripherals, external memory, or other devices.

The various embodiments enable the processor of the UAV to manage network communication of the UAV. By managing the network communication of the UAV as described, the various embodiments improve the operation of the UAV and the communication network. The various embodiments may reduce RF interference caused by signal transmissions of the UAV to base stations and/or other communication devices in the communication network. The various embodiments may also increase communication efficiency in the communication network through the reduction of the signal interference that may be caused by the UAV.

Various embodiments illustrated and described are provided merely as examples to illustrate various features of the claims. However, features shown and described with respect to any given embodiment are not necessarily limited to the associated embodiment and may be used or combined with other embodiments that are shown and described. Further, the claims are not intended to be limited by any one example embodiment. For example, one or more of the operations of the methods 300 and 400 may be substituted for or combined with one or more operations of the methods 300 and 400, and vice versa.

The foregoing method descriptions and the process flow diagrams are provided merely as illustrative examples and are not intended to require or imply that the operations of various embodiments must be performed in the order presented. As will be appreciated by one of skill in the art the order of operations in the foregoing embodiments may be performed in any order. Words such as "thereafter," "then," "next," etc. are not intended to limit the order of the operations; these words are used to guide the reader through the description of the methods. Further, any reference to claim elements in the singular, for example, using the articles "a," "an," or "the" is not to be construed as limiting the element to the singular.

Various illustrative logical blocks, modules, circuits, and algorithm operations described in connection with the embodiments disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such embodiment decisions should not be interpreted as causing a departure from the scope of the claims.

The hardware used to implement various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver smart objects, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more aspects, the functions described may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in a processor-executable software module or processor-executable instructions, which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage smart objects, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed embodiments is provided to enable any person skilled in the art to make or use the claims. Various modifications to these embodiments will be readily apparent to those skilled in the art, and the generic principles defined herein may be applied to other embodiments without departing from the spirit or scope of the claims. Thus, the present disclosure is not intended to be limited to the embodiments shown herein but is to be accorded the widest scope consistent with the following claims and the principles and novel features disclosed herein.

What is claimed is:

1. A method of managing network communication of an unmanned autonomous vehicle (UAV), comprising:
   determining an altitude of the UAV;
   determining, based on the altitude of the UAV, an interference metric that represents a level of radio frequency interference between the UAV and one or more base stations of a communication network;
   adjusting one or more communication parameters of a communication link between the UAV and the one or more base stations of the communication network based on the interference metric, wherein the one or more communication parameters comprise a quality of service of the communication link, a packet size of the communication link, a modulation and coding scheme of the communication link, a handover parameter of the communication link, a bandwidth used for the communication link, or a frequency used over the communication link, and transmitting one or more signals, from the UAV to the one or more base stations of the communication network, based on the adjusted one or more communication parameters.

2. The method of claim 1, further comprising:
determining a speed of the UAV;
wherein determining the interference metric is further based on the speed of the UAV.

3. The method of claim 1, wherein the one or more communication parameters further comprises a data rate versus altitude function.

4. The method of claim 1, wherein the interference metric is further based on a number of base stations of the communication network detected by the UAV.

5. The method of claim 1, wherein the interference metric is further based on network condition information about the communication network.

6. The method of claim 1, wherein adjusting the one or more communication parameters of the communication link is performed by a processor of the UAV.

7. The method of claim 1, wherein adjusting the one or more communication parameters of the communication link is performed by a processor of the UAV in response to an instruction received from the communication network.

8. The method of claim 1, wherein the method is performed by a network element of the communication network.

9. The method of claim 8, wherein adjusting the one or more communication parameters of a communication link between the UAV and a communication network based on the altitude of the UAV comprises adjusting, based on an instruction from the network element, one or more communication parameters of a respective communication link between two or more UAVs and the communication network.

10. An unmanned autonomous vehicle (UAV), comprising:
a radio module; and
a processor coupled to the radio frequency resource and configured to:
determine an altitude of the UAV;
determine, based on the altitude of the UAV, an interference metric that represents a level of radio frequency interference between the UAV and one or more base stations of a communication network;
adjust one or more communication parameters of a communication link between the UAV and the one or more base stations of the communication network based on the interference metric, wherein the one or more communication parameters comprise a quality of service of the communication link, a packet size of the communication link, a modulation and coding scheme of the communication link, a handover parameter of the communication link, a bandwidth used for the communication link, or a frequency used over the communication link, and
transmit, via the radio module, one or more signals, from the UAV to the one or more base stations of the communication network, based on the adjusted communication parameter.

11. A non-transitory processor-readable storage medium having stored thereon processor-executable instructions configured to cause a processor of an unmanned autonomous vehicle (UAV) to perform operations comprising determining an altitude of the UAV;
determining, based on the altitude of the UAV, an interference metric that represents a level of radio frequency interference between the UAV and one or more base stations of a communication network;
adjusting one or more communication parameters of a communication link between the UAV and the one or more base stations of the communication network based on the interference metric, wherein the one or more communication parameters comprise a quality of service of the communication link, a packet size of the communication link, a modulation and coding scheme of the communication link, a handover parameter of the communication link, a bandwidth used for the communication link, or a frequency used over the communication link, and
transmitting one or more signals, from the UAV to the one or more base stations of the communication network, based on the adjusted one or more communication parameters.

12. The non-transitory processor-readable storage medium of claim 11, wherein the stored processor-executable instructions are configured to cause the processor of the UAV to perform operations further comprising:
determining a speed of the UAV;
wherein determining the interference metric is further based on the speed of the UAV.

13. The UAV of claim 10, wherein the processor is further configured with processor-executable instructions to:
determine a speed of the UAV; and
wherein determine the interference metric is further based on the speed of the UAV.

14. The UAV of claim 10, wherein the one or more communication parameters further comprises a data rate versus altitude function provided by the communication network.

15. The UAV of claim 10, wherein the interference metric is further based on a number of base stations of the communication network detected by the UAV.

16. The UAV of claim 10, wherein the interference metric is further based on network condition information about the communication network.

17. The UAV of claim 10, wherein the processor is further configured to adjust the one or more communication parameters of the communication link in response to an instruction received from the communication network.

18. A network element of a communication network, comprising:
a communication interface; and
a processor coupled to the communication interface and configured to:
determine an altitude of an unmanned autonomous vehicle (UAV);
determine, based on the altitude of the UAV, an interference metric that represents a level of radio frequency interference between the UAV and one or more base stations of a communication network;
adjust one or more communication parameters of a communication link between the UAV and the one or more base stations of the communication network based on the interference metric, wherein the one or more communication parameters comprise a quality of service of the communication link, a packet size of the communication link, a modulation and coding scheme of the communication link, a handover parameter of the communication link, a bandwidth used for the communication link, or a frequency used over the communication link; and transmit a command to the UAV to use the adjusted communication parameter for transmitting signals from the UAV.

19. The network element of claim 18, wherein the processor is further configured to:

determine a speed of the UAV; and wherein determine the interference metric is further based on the speed of the UAV.

20. The network element of claim 18, wherein the one or more communication parameters further comprises a data rate versus altitude function.

21. The network element of claim 18, wherein the processor is further configured to:

receive flight information from the UAV; and wherein determine the altitude of the UAV is based on the flight information received from the UAV.

* * * * *